United States Patent
Guan

(10) Patent No.: US 8,988,873 B2
(45) Date of Patent: Mar. 24, 2015

(54) ELECTRONIC DEVICE WITH AIR GUIDING PLATES

(71) Applicant: Zhi-Bin Guan, New Taipei (TW)

(72) Inventor: Zhi-Bin Guan, New Taipei (TW)

(73) Assignee: Zhongshan Innocloud Intellectual Property Services Co., Ltd., Zhongshan (CN)

( * ) Notice: Subject to any disclaimer, the term of this patent is extended or adjusted under 35 U.S.C. 154(b) by 309 days.

(21) Appl. No.: 13/678,876

(22) Filed: Nov. 16, 2012

(65) Prior Publication Data

US 2014/0118935 A1    May 1, 2014

(51) Int. Cl.
*H05K 7/20* (2006.01)
*H05K 5/00* (2006.01)

(52) U.S. Cl.
CPC ........ *H05K 7/20727* (2013.01); *H05K 7/20145* (2013.01)
USPC ................. 361/679.51; 361/679.49; 454/184; 174/547

(58) Field of Classification Search
CPC ........... H05K 7/20554–7/20836; H01L 23/467
USPC ....................... 361/679.46–679.54, 688–723; 165/80.1–80.5, 104.33, 185; 174/547–548

See application file for complete search history.

(56) References Cited

U.S. PATENT DOCUMENTS

| | | | | |
|---|---|---|---|---|
| 5,410,448 | A * | 4/1995 | Barker et al. | 361/695 |
| 7,123,478 | B2 * | 10/2006 | Chen | 361/695 |
| 7,839,631 | B2 * | 11/2010 | Lee et al. | 361/679.49 |
| 7,843,683 | B2 * | 11/2010 | Suffern et al. | 361/679.46 |
| 8,477,496 | B2 * | 7/2013 | Zhang et al. | 361/695 |
| 2008/0068795 | A1 * | 3/2008 | Pav et al. | 361/695 |
| 2011/0292602 | A1 * | 12/2011 | Narasimhan et al. | 361/692 |
| 2013/0301217 | A1 * | 11/2013 | Lee et al. | 361/692 |
| 2014/0036433 | A1 * | 2/2014 | Guan | 361/679.32 |

* cited by examiner

*Primary Examiner* — Zachary M Pape

(74) *Attorney, Agent, or Firm* — Novak Druce Connolly Bove + Quigg LLP

(57) ABSTRACT

An electronic device includes a main body, two air guiding plates, and a cover. The main body includes a bottom plate and two side plates extending up from opposite sides of the bottom plate. A number of mounting tabs extend from an inner side of each side plate, arranged in a row. A circuit board is supported on the bottom plate, and includes a number of electronic components located between the two rows of mounting tabs. A cutout is defined in a top of each mounting tab. A number of hooking slots are defined in a bottom of each air guiding plate. Top walls of the hooking slots of each air guiding plate are respectively supported by bottom walls of the cutouts of the corresponding row of mounting tabs. The cover is covered on a top of the main body and abuts tops of the air guiding plates.

3 Claims, 2 Drawing Sheets

ELECTRONIC DEVICE WITH AIR GUIDING PLATES

BACKGROUND

1. Technical Field

The present disclosure relates to an electronic device including air guiding plates.

2. Description of Related Art

In a server, air guiding plates are used to guide airflow, to increase heat dissipating efficiency of electronic components in the server. However, the air guiding plates are generally screwed to the chassis of the server; thus, mounting the air guiding plates can be time-consuming.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
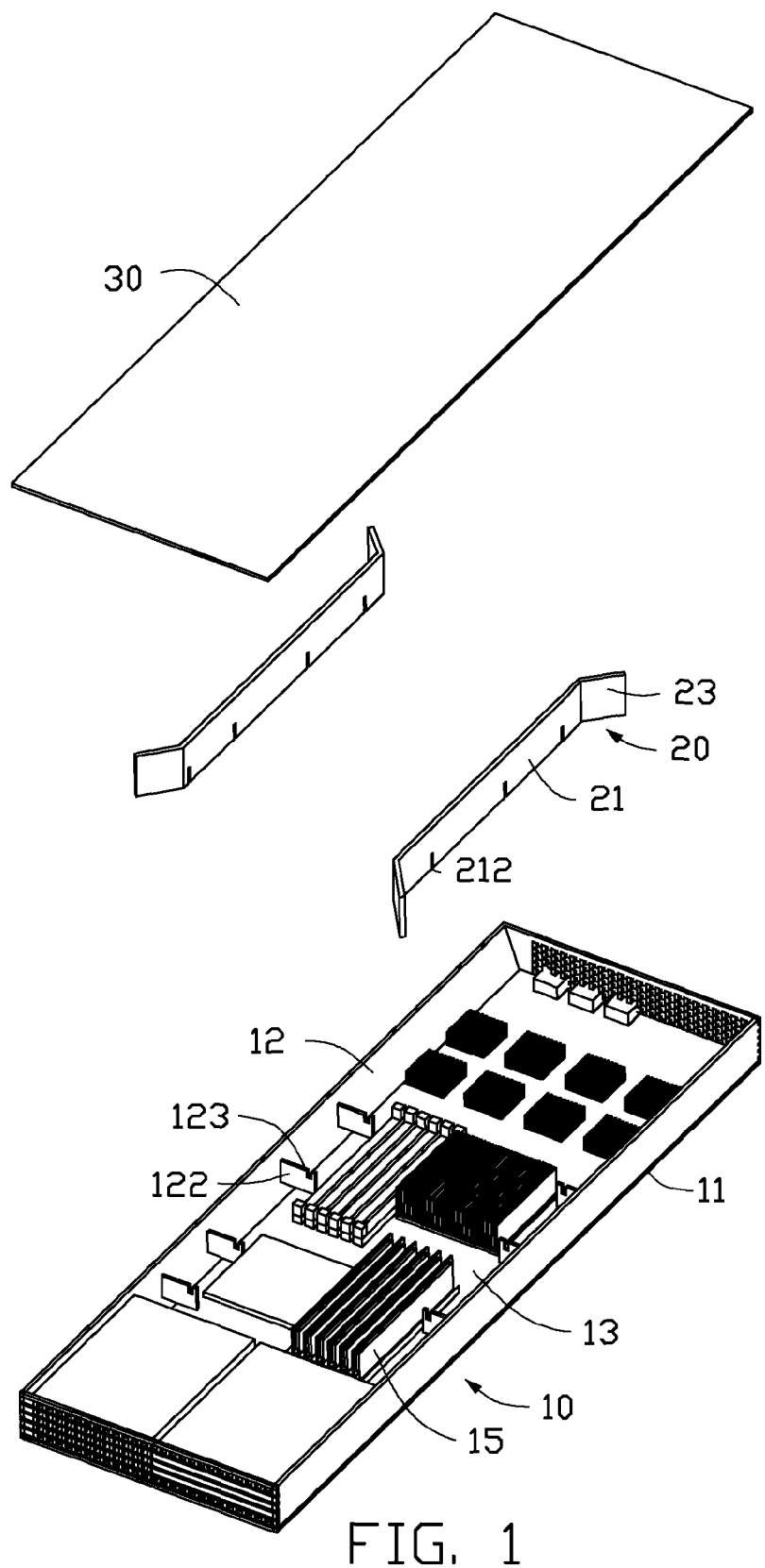
FIG. 1 is an isometric, exploded view of an exemplary embodiment of an electronic device.

FIG. 1 shows an exemplary embodiment of an electronic device including a main body 10, two air guiding plates 20, and a cover 30.

The main body 10 includes a bottom plate 11 and two side plates 12 that extend substantially perpendicularly up from opposite sides of the bottom plate 11. A circuit board 13 is mounted on the bottom plate 11. A plurality of mounting tabs 122 extends from an inner side of each side plate 12 in a substantially perpendicular manner and is arranged in a row along a lengthwise direction of the side plate 12. A cutout 123 is defined in a top of each mounting tab 122, away from the corresponding side plate 12. A plurality of electronic components 15, such as internal memories, is mounted to the circuit board 13 and located between the rows of mounting tabs 122 of the side plates 12.

Each air guiding plate 20 includes a base body 21 and two guiding portions 23, slantingly extending from opposite ends of the base body 21 away from each other. A plurality of hooking slots 212 is defined in a bottom of the base body 21.

Figure 2:
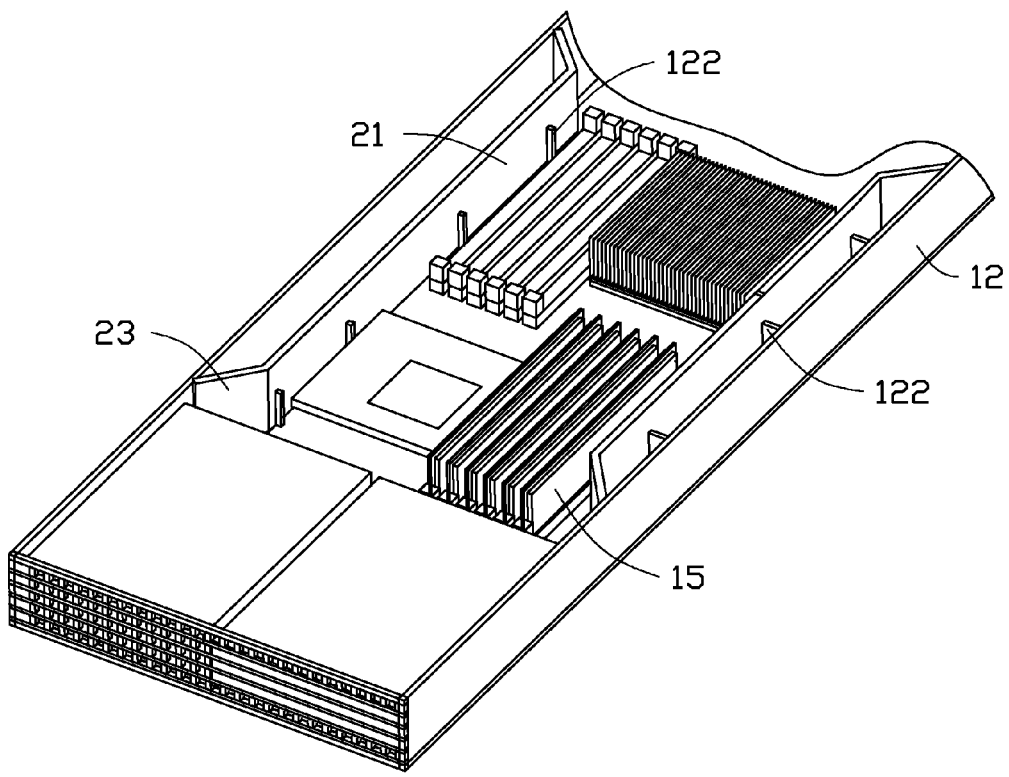
FIG. 2 is an isometric, assembled view of FIG. 1.

FIG. 2 shows in assembly, top walls of the hooking slots 212 of each air guiding plate 20 are respectively supported on bottom walls of the cutouts 123 of the mounting tabs 122 of the corresponding side plate 12. Each mounting tab 122 is clamped by opposite sidewalls bounding the corresponding hooking slot 212, and the base body 21 is clamped by opposite sidewalls bounding the cutouts 123. The bottoms of the air guiding plates 20 abut the circuit board 13. A distal end of each guiding portion 23 faces and abuts the corresponding side plate 12. The cover 30 is covered on a top of the main body 10 and abuts tops of the air guiding plates 20.

When the electronic device works, guided by the guiding portions 23 at an end, airflow in the main body 10 flows in a space between the air guiding plates 20 and flows out of the space guided by the guiding portions 23 at the other end. The base bodies 21 are near the electronic components 15, so that the airflow mostly flows through the electronic components 15. Thus, the heat dissipating efficiency of the electronic components 15 is increased.

It is believed that the present embodiments and their advantages will be understood from the foregoing description, and various changes may be made thereto without departing from the spirit and scope of the description or sacrificing all of their material advantages, the examples hereinbefore described merely being embodiments.

What is claimed is:

1. An electronic device, comprising:
    a main body comprising a bottom plate and two side plates extending up from opposite sides of the bottom plate, a plurality of mounting tabs extending from an inner side of each side plate and arranged in a row substantially parallel to the side plate, a top of each mounting tab defining a cutout;
    a circuit board supported on the bottom plate, and comprising a plurality of electronic components located between the two rows of mounting tabs; and
    two air guiding plates each defining a plurality of hooking slots in a bottom of the air guiding plate, top walls of the plurality of hooking slots of each air guiding plate are supported by bottom walls of the cutouts of the corresponding row of mounting tabs; and
    a cover covered on a top of the main body and abutting tops of the two air guiding plates.

2. The electronic device of claim 1, wherein each air guiding plate includes a base body, the plurality of hooking slots are defined in a bottom of the base body, and two air guiding portions slantingly extend from opposite ends of the base body away from each other and abut the corresponding side plate.

3. The electronic device of claim 1, wherein the two air guiding plates abut the circuit board.

* * * * *